United States Patent
Toy et al.

(10) Patent No.: US 6,451,155 B1
(45) Date of Patent: Sep. 17, 2002

(54) METHOD USING A THIN ADHESION PROMOTING LAYER FOR BONDING SILICONE ELASTOMERIC MATERIAL TO NICKEL AND USE THEREOF IN MAKING A HEAT SINK ASSEMBLY

(75) Inventors: Hilton T. Toy, Wappingers Falls; David L. Edwards, Poughkeepsie; Da-Yuan Shih, Poughkeepsie; Ajay P. Giri, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 1195 days.

(21) Appl. No.: 08/735,925

(22) Filed: Oct. 24, 1996

Related U.S. Application Data

(62) Division of application No. 08/565,485, filed on Nov. 30, 1995, now abandoned.

(51) Int. Cl.⁷ ............................................. C09J 101/00
(52) U.S. Cl. ....................... 156/325; 156/151; 156/319; 427/208.2; 428/625; 428/626
(58) Field of Search ................................. 156/325, 319, 156/151; 427/208.2; 428/625, 626

(56) References Cited

U.S. PATENT DOCUMENTS

| | | | | |
|---|---|---|---|---|
| 3,858,635 A | * | 1/1975 | Nakamoto et al. | 428/625 |
| 4,446,197 A | * | 5/1984 | Benko | 428/625 |
| 4,582,564 A | | 4/1986 | Shanefield | |
| 4,749,625 A | * | 6/1988 | Obayashi et al. | 428/625 |
| 4,872,932 A | * | 10/1989 | Yoshikawa et al. | 156/151 |
| 5,343,073 A | | 8/1994 | Parthasarathi et al. | |
| 5,387,815 A | | 2/1995 | Nishiguichi | |
| 5,396,403 A | | 3/1995 | Patel | |

* cited by examiner

*Primary Examiner*—John J. Gallagher
(74) *Attorney, Agent, or Firm*—Whitham, Curtis & Christofferson, P.C.; Tiffany L. Townsend

(57) ABSTRACT

A heat sink assembly and method for attaching a multi-chip module cap to a polymeric heat sink adhesive by means of a thin adhesion-promoting metal film layer, which provides an interfacial bond between the cap and polymeric adhesive meeting package performance and reliability requirements. There is also a method of promoting adhesion between a silicon-containing polymeric adhesive and a metal surface using the thin adhesion-promoting metal film layer and the products thereof.

10 Claims, 1 Drawing Sheet

METHOD USING A THIN ADHESION PROMOTING LAYER FOR BONDING SILICONE ELASTOMERIC MATERIAL TO NICKEL AND USE THEREOF IN MAKING A HEAT SINK ASSEMBLY

CROSS REFERENCE TO RELATED APPLICATION

This application is a divisional application of Ser. No. 08/565,485, filed Nov. 30, 1995, now abandoned.

BACKGROUND OF THE INVENTION

1. Field of the Invention

The invention is generally directed to an adhesion promoting layer for bonding polymeric adhesives to metal and, more particularly, a heat sink assembly using the adhesion promoting layer as a thin adherent interfacial bonding layer between a multi-chip module cap and a polymeric adhesive used for attachment of a heat sink.

2. Description of the Related Art

Electronic devices such as computers rely on a large number of integrated circuits and other electronic components for their operation, most of which are mounted on printed circuit boards. Many of these components generate heat during normal operation. In order to accommodate increased demands for high operational speeds, a multi-chip module ("MCM") system has been developed and put into practical use. An MCM mounts a plurality of integrated circuit (IC) chips next to each other on a single substrate. This MCM arrangement can permit high density assembly and effectively reduces the lengths of connecting wires to endow the electronic circuit with increased operational speed.

However, as operational speed requirements increase, the amount of heat that the components must dissipate generally also will increase. Many components need the help of external heat sinks to dissipate the operational heat generated. The term "heat sink", as used herein, generally refers to a passive device, for example, an extruded aluminum plate with a plurality of fins or a water cooled cold plate, that is thermally coupled to an electronic component(s) to absorb heat from the component(s) and dissipate such absorbed heat into the air or water by convection. While the heat sink itself generally is passive in nature, it is to be understood that it is within the scope of this terminology to optionally direct a fan means at or attach a fan means to the heat sink fins to increase the rate of convective heat transfer, if desired, such as described in U.S. Pat. No. 5,396,403 (Patel).

As a matter of practical necessity, many components often will share a common heat sink where high packing density and/or small individual component sizes are involved. One approach to providing such a shared heat sink is described in U.S. Pat. No. 5,396,403 (Patel), mentioned above, which relates to a cooling structure for high power MCM systems using flip chip technology. In the Patel patent, the primary heat path is for heat to dissipate, in the following sequence, through the metallized back sides of high power chips having the heat generating components mounted on the opposite chip sides, through an interface of indium solder, through a thermally conductive plate of silicon carbide or a tungsten copper composite, through an interface of thermal paste, and lastly through a heat sink such as made of extruded aluminum. The heat sink described by the Patel patent is an integral structure which both constitutes a housing for the MCM and it is finned on its exterior to dissipate the heat into the surrounding air by convection. Yet, the need to form and align four separate and distinct thermal intermediary layers, mentioned above, in-between the chips and the heat sink without corrupting the device represents a relatively complicated and intensive manufacturing scheme for attaching the heat sink to the chips.

Another proposal, described in U.S. Pat. No. 5,387,815 (Nishiguchi), relates to a structure for cooling one or more high power flip chips in a semiconductor module. The stated objective of the Nishiguchi patent is to provide an excellent heat dissipation design with a small number of components. The Nishiguchi patent describes a semiconductor chip module having a substrate on which a wiring portion is formed, a semiconductor chip mounted so as to face a circuit side down to the wiring portion, a heat sink with an end in contact with a side opposite to the circuit side of the semiconductor chip, and a cap enclosing the semiconductor chip and having an opening exposing externally the other end of the heat sink. The Nishiguchi patent describes a metal film having a wetting property with respect to the solder to be used as being formed on the inner wall of the cap opening and on the tip and/or side surface of the heat sink which is inserted into the cap. An adhesive solder material is filled in the gap between the tip portion of the heat sink and the back side of the semiconductor chip, and adhesive solder material is also filled between the metal films on the inner wall of the cap opening and the side surface of the heat sink to hermetically seal the cap. However, the time and resources needed to be devoted to forming and precisely aligning cap openings and heat sinks inserted therethrough with chip surfaces, as well as concerns for device corruption due to solder overflow and the needed additional precautions taken in this respect, will restrict yield and reliability.

As another approach, a heat sink for thermal cooling has been attached with a filled silicone elastomer adhesive to the upper exterior side of a flat-topped MCM cap. The silicone elastomer adhesive used in this regard has been a silicone potting resin conventionally used in the electronic industry for encapsulating electronic assemblies and devices (e.g., the "Sylgard" trademarked series of silicone resins, made by Dow-Corning). The inner surface of this flat-topped MCM cap thermally communicates with chips housed in the cap via a thermal paste. Attachment of the heat sink to the outside of the MCM cap with the silicone resin has been accomplished directly to an anodized aluminum or a ceramic cap surface.

However, a problem arises when the attachment locus is a high performance MCM cap made of a highly thermal conductive material containing copper, such as copper tungsten (CuW). Usage of these copper-containing caps have become more relevant as thermal coefficient of expansion and thermal dissipation concerns change and evolve with ever increasing power needs. In order to attach a heat sink to the back surface of an MCM cap containing copper, such copper-containing caps have been metallized to provide and maintain a hermetically encapsulated package. A primary reason that such metallization is needed is attributable to the presence of an exposed continuous copper network in a composite such as copper tungsten, for example, which is susceptible to corrosion. The problem is heightened by the fact that contemporary MCM's often must maintain operational capability for ten years or more. One such metallization technique involves nickel plating the entire surface of the cap. The nickel-plated cap is selectively gold plated on the seal band area of the cap so that a hermetic solder seal (e.g., Pb/Sn) could be provided between the cap and a substrate supporting the chips.

However, the direct adhesive bond between the nickel plating on the cap and the silicone resin is inadequate as the nickel and the silicone have compatibility problems. Consequently, the nickel-silicone bond is prone to delamination and thus fails to meet current package performance and reliability requirements. However, the resort to bonding the highly conductive cap to a separate, discrete heat sink structure via the nickel to silicone resin bond is difficult to design around, especially where a combination of low thermal coefficient of expansion and high thermal conductivity are desired. For example, high cooling requirements tend to require a large (tall) heat sink. It would be very difficult and very costly, if not impossible, to fabricate an integral cap and heat sink with highly conductive cap materials such as either copper tungsten (CuW) or aluminum silicon carbide (AlSiC). In the case of CuW, the additional weight would also constitute a large liability (e.g., WCu is about six times as dense as aluminum).

From a more general perspective, the use of a thin layer containing chromium, zinc, or preferably a mixture of chromium and zinc, to enhance the adhesion between a lead frame and a polymeric molding resin, has been described in U.S. Pat. No. 5,343,073 (Parthasarathi). A mixture of chromium and zinc with a zinc-to-chromium ratio in excess of about 4:1 is described as most preferred. The lead frame is formed from an electrically conductive metal substrate.

It is also known to use a tantalum, titanium, or chromium film to promote adhesion between a metal substrate and a fluorocarbon film. Also, U.S. Pat. No. 4,582,564 (Shanefield) describes a method of forming adherent metal layers on certain epoxy substrates by providing a thin metal film on surfaces of the epoxy substrates after the substrates are pre-conditioned by sputter etching to remove weak boundary layers from the surface, and then depositing primary metal films over the thin adhesion-promoting base metal film. The thin adherent metal films are formed by vacuum depositing an adherent thin metal film of chromium, nickel, a nickel-vanadium alloy, platinum, palladium, or titanium in thicknesses from 50 to 10,000 Ångstroms, generally 1,000 Ångstroms, onto an epoxy surface. The Shanefield patent characterizes the use of the vacuum-deposited adhesion-promoting films as appearing to be unique for only rubber-modified epoxy and epoxies having a high degree of unsaturation in the polymer chain.

From the foregoing it will be apparent that there remains a need for a way to effectively bond a silicone elastomer adhesive to a metal having low adherability to that adhesive, such as nickel,,and that there remains a particular need for a facile and less precision taxing approach to consolidate a heat sink assembly with an MCM in which a nickel-plated, highly thermal conductive MCM cap must be reliably bonded to a silicone elastomer, which, in turn, is used to join a heat sink to the cap.

SUMMARY OF THE INVENTION

It is an object of this invention to provide an adhesion promoting layer affording good bonding between polymeric adhesives and metal.

It is another object of this invention to provide an adhesion promoting layer providing high bonding efficacy between a silicon-containing polymeric adhesive and a metallic material otherwise having poor direct adherability thereto.

It is yet another object of this invention to provide a heat sink assembly for dissipating heat generated by chips in a multi-chip module ("MCM") having means for providing a good reliable bond as between an MCM cap and a heat sink adhesive used to attach a heat sink to the MCM.

Briefly and in general terms, in one embodiment of the present invention there is a heat sink assembly including a thin adherent metal film provided between the metal-surfaced cap of an MCM and a polymeric adhesive layer used to attach a heat sink to the MCM, where the thin adherent metal film is a type of metallic material and of a thickness effective to bond the cap surface to the polymeric adhesive. The MCM is of the type involving a multi-chip module having a substrate and at least one integrated circuit chip mounted on a first surface of the substrate with the cap enclosing the integrated circuit chip(s), and where means is also provided for effecting thermal transmission between the integrated circuit chip(s) and the cap. The thin adherent metal film promotes bonding between the upper surface of the cap surface and the polymeric heat sink adhesive, and thereby provides an interfacial bond meeting package performance and reliability requirements.

The polymeric adhesive used to bond the heat sink to the MCM can be a thermoplastic, a thermosetting, or an elastomeric polymeric material having suitable heat sink adherability, water impermeability, resistance to swelling in hydrocarbon solvents, and the like attributes that are appropriate for an MCM environment.

In one advantageous embodiment of the invention, the aforesaid thin adherent metal film is employed to promote and provide adhesion between: (a) a metal surface of an MCM cap having poor direct adherability to silicon-containing polymeric adhesives, and (b) a silicon-containing polymeric adhesive (e.g., a silicone elastomeric material) being used to attach a heat sink to the MCM. For purposes of this invention, a metal having "poor direct adherability" to silicon-containing polymeric adhesives means the metal has a shear strength to Sylgard™ 6605 silicone elastomeric material (direct contact) of less than 150 lbs./inch$^2$ (p.s.i.). Metals having such poor direct adherability to silicon-containing polymeric adhesives, such as silicone elastomeric materials in particular, include, for example, nickel, copper, silver, gold, and alloys thereof.

In one preferred embodiment of the present invention, the thin, interfacial adherent metal film is formed of a metal selected from Groups IVB, VB, VIB of the Periodic Table of the elements (CAS version), or alloys thereof, excluding the radioactive elements Unq, Unp, and Unh. Chromium, or an alloy of chromium, is the most preferred metal for the thin, interfacial adherent metal film used in this invention.

The thin adherent metal film used in the present invention is deposited on a metal surface, such as a nickel plated MCM cap, in a film thickness of from 50 Ångtroms to 10,000 Ångstroms, more preferably from about 450 Ångtroms to about 550 Ångstroms.

In another preferred embodiment of the invention, the MCM cap surface is nickel, such as a nickel plating formed on a cap substrate that would be susceptible to corrosion if left exposed (i.e., unplated). For instance, when the cap contains copper, such as in a copper tungsten composite, and the nickel-plating serves to prevent corrosion of the copper component of the cap.

The technique for depositing the thin adherent metal film on a metal surface, such as a metal having poor adherability to silicon-containing polymeric adhesives (e.g., a silicone elastomeric material), includes vacuum deposition techniques, such as sputter deposition, and also other ion plating deposition techniques such as electrolytic plating, which permit thin film formation. Sputter deposition is the preferred mode of depositing the thin adherent metal film on the metal surface.

The present invention offers many benefits and advantages. To name several, the present invention uses a facile yet effective metallization step to promote and provide adhesion between an MCM cap plated with a metal (e.g., nickel) otherwise having low direct adherability to silicon-containing polymeric adhesives, such as a silicone elastomeric material, and a silicon-containing polymeric adhesive being used to attach a heat sink to the cap. This inventive metallization step can be accomplished without adversely disturbing hermetic sealing metallurgy. For example, the metallization of a nickel-plated MCM cap can be accomplished without damaging or adversely affecting a metallized gold plated seal band used for hermetic sealing of the cap to a substrate. Further, the heat sink assembly of this invention can fully withstand temperature cycling, T/H and shock exposures expected in the operating environment of an MCM device over extended periods of time and operation. The invention also reduces the cost of otherwise mounting a heat sink with mechanical hardware, and it minimizes space requirements by eliminating mounting hardware. Also, the invention affords manufacturing flexibility as to the timing of the metallization of a nickel-plated MCM cap. For example, the nickel-plated MCM cap surface can be pre-coated with the thin adherent metal film that promotes adhesion to silicon-containing polymeric adhesives, for instance, before attachment of the cap to the substrate and integrated circuit chips, thereby eliminating risk of module yield loss. The invention also provides a heat sink assembly in combination with an MCM system having enhanced tolerance to combined stresses of high temperature, high humidity, and/or high pressure, as demonstrated by a highly accelerated stress test (i.e., "HAST"). The highly accelerated stress test refers to putting parts to be tested in a sealed chamber where they are simultaneously subjected to high temperature (125° C.), high humidity (85%), and high pressure (about 3 atmospheres absolute), for 24 hours. In this manner, stress equivalent to the life of the product can take place in an accelerated number of hours.

In this invention, the terminology "polymeric adhesive(s)" means a natural or synthetic adhesive substance containing polymers.

For purposes of this invention, the terminology "silicon-containing polymeric adhesive(s)" means an adhesive substance containing polymeric molecules each having at least one silicon atom in any of the backbone, pendant groups and/or terminal groups of the polymeric chain.

In this invention, the terminology "silicon-containing elastomeric material" means a silicon-containing polymeric adhesive that is elastomeric. The term "elastomeric" refers to polymers that are capable of significant elastic deformations.

In this invention, the terminology "silicone elastomeric material" means a silicon-containing elastomeric material that is a composition containing silicone polymers, where the silicone polymers are each based on a polymeric chain featuring alternating silicon (Si) and oxygen (O) atoms in the backbone, and where the backbone is devoid of or substantially devoid of carbon atoms excluding consideration of terminal end groups, and the silicon polymers also have organic side groups attached to silicon atoms located in the backbone.

BRIEF DESCRIPTION OF THE DRAWINGS

The foregoing and other objects, aspects and advantages will be better understood from the following detailed description of the preferred embodiments of the invention with reference to the drawings, in which.

Figure 1:
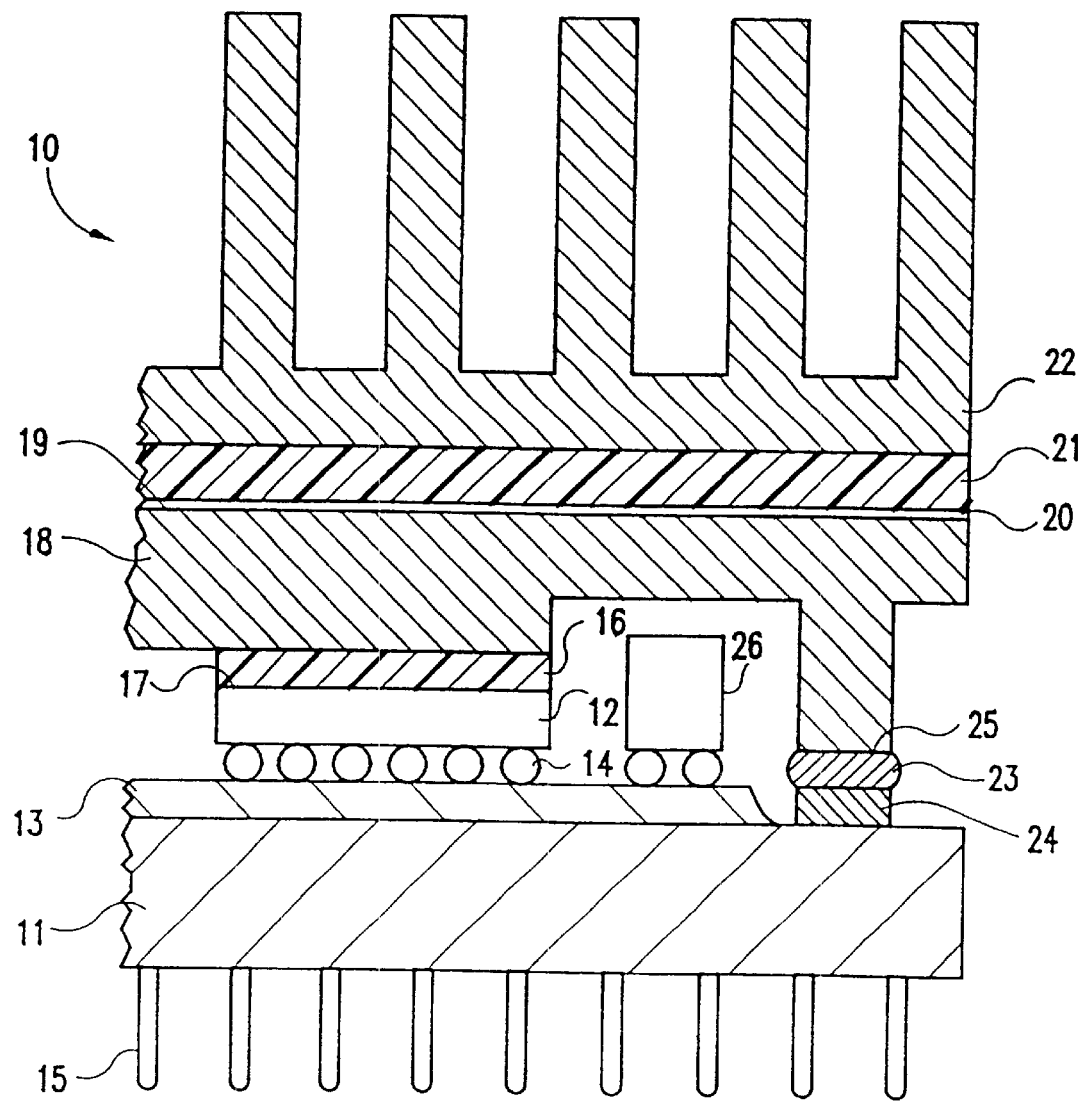
FIG. 1 is a cross-sectional view of a heat sink assembly according to the invention depicting a representative right-side section of the device.

It is understood that features depicted in FIG. 1 have been enlarged or otherwise modified in scale for purposes of facilitating the discussion of the invention herein.

DETAILED DESCRIPTION OF THE PREFERRED EMBODIMENTS OF THE INVENTION

The invention provides an adhesion promoting layer affording good bonding between polymeric adhesives and metals otherwise having poor direct adhesion to such polymeric adhesives. One advantageous application of the invention involves a heat sink assembly and means for attaching a silicon-containing polymeric adhesive for a heat sink to an otherwise poorly adherable cap surface thereto, such as a nickel-plated MCM cap, which yields cap-to-heat sink bond strength meeting package performance and reliability requirements.

Referring now to the drawings, and more particularly to FIG. 1, there is shown a heat sink assembly 10 according to an embodiment of the invention, including nickel-plated cap 18 that is fixedly bonded to a layer of silicone elastomeric material 21 (used to attach a heat sink 22) by means of an interfacial, thin adherent metal film 20. The thin adherent metal film is a metal material, such a chromium, or another metal selected from Groups IVB, VB, VIB of the Periodic Table of the elements (CAS version), or an alloy thereof, excepting the radioactive elements Unq, Unp, and Unh, that is applied in a relatively thin thickness, such as by vacuum deposition techniques, which displays mutual compatibility and adhesion for diverse substrates such as nickel metal and silicone elastomeric material.

In more detail, the heat sink assembly 10 is illustrated in combination with an MCM of a kind having a lower substrate 11 and a plurality of integrated circuit chips (only one chip 12 shown for sake of simplicity in the illustration) mounted face-down to electrodes on a thin film upper substrate surface 13 via solder bumps 14. The lower substrate 11 is made of an insulating material such as a "9211" ceramic and has plural lead pins 15 extending from the lower side thereof, the lead pins being connected to electric circuits formed with the upper substrate 13. The upper substrate 13 is made of an insulating material of low dielectric constant and has patterned electrical wiring circuitry provided thereon, such as a polyimide multi-layered wiring structure.

A thermal paste or grease 16, such as metal (e.g., aluminum) and/or metal oxide (e.g., alumina) particles dispersed in a PAO (polyalpha olefin oil), hydrocarbon mineral oil, or silicone oil, is provided between the back side 17 of the chip 12 and the inner side of the cap 18. PAO oil is preferred as it allows reworkability. The thermal paste is applied in a thickness of about 9 mils (i.e., about 229 $\mu$m). Also, although not particularly relevant to the present invention, the MCM typically will include, as a matter of course, other electronic devices, such as capacitor 26 shown in FIG. 1, and/or chips that are circuit-side up with wiring (not shown), which are not thermally bonded to the inner side of the cap.

The cap 18 is formed of a highly conductive material such as copper tungsten (CuW), aluminum silicon carbide, aluminum, aluminum nitride, cubic boron nitride, and diamond, and the like. Caps containing copper, especially copper in a continuous network, such as that encountered in copper tungsten composites, are of particular interest in this invention. This is because of the particular corrosion susceptibilities of the copper-containing caps, which necessitates nickel-plating and the like. The cap (before nickel plating) has a thickness of about 3 mm (at the seal wall), and has a flat, squared top surface having a side length of about 63 mm.

The cap 18 is completely precoated over its entire exterior surface area, and the inside surfaces typically, with a thin nickel plating applied by conventional evaporation or ion plating techniques (e.g., electroplating, electroless plating) to a minimum thickness of 1.0 $\mu$m, preferably a thickness of from about 2.5 $\mu$m to about 10 $\mu$m. The thin outer metal plating feature of cap 18 is not separately shown in FIG. 1. in order to simplify the drawing for this discussion. Nickel coatings are preferred for plating of copper tungsten caps. Nickel coatings can be deposited on the bare cap (substrate) by electroplating from sulphamate baths or electroless platings from Ni(B) or Ni(P) baths. It is to be understood that the invention also encompasses alternate cap materials or plating materials thereon encompassing other metals that are poorly adherable to silicone elastomeric materials, such as copper, silver, gold, or alloys thereof. Although, cost considerations may militate against usage of silver or gold in this manner, and if bare copper is used, a heightened corrosion risk must be considered. The invention also is contemplated to be applicable to MCM caps having other types of metal platings, such as cobalt, Co/Ni alloys, palladium, rhodium, ruthenium, which, although perhaps having lesser adhesion problems with silicon-containing polymer adhesives, and silicone elastomeric materials in particular, nonetheless could have their heat sink-to-metal bonds promoted and achieved by the use of the thin adherent (interfacial) metal film according to this invention.

A thin adherent metal film 20 is applied to the nickel coating on the top surface 19 of cap 18 which will ultimately serve as the adhesion-promoting layer as between the nickel surface on the cap 18 and a silicone elastomeric material 21 used as an adhesive to attach the finned heat sink 22. The heat sink can be formed of any material having appropriate thermal properties for the function, and it can be formed, for example, as from extruded or machined aluminum or other suitable material.

In order to form the thin adherent metal film 20 on the nickel plated cap 18, one preferred embodiment includes the following protocol. The nickel-plated cap 18 is pre-cleaned, for example, in an ethanol or isopropanol ultrasonic or recirculating bath, to remove any particle contaminates. The cleaned cap is vacuum baked at 100° C. minimum to volatize all residual liquid solvent. The cleaned, nickel-plated cap is then cleaned (scrubbed) by any convenient conventional sputter etching technique, e.g. ion beam, glow discharge, or RF (DC and magnetron) sputter etching, sufficient to remove a native nickel oxide surface layer on the nickel. Typically, sputter etching is conducted adequate to remove greater than 20 Ångstroms of surface material from the nickel to accomplish removal of the native nickel oxide.

Subsequent to sputter etching, thin adherent metal 20, preferably in a film thickness of from 50 Ångstroms to 10,000 Ångstroms, more preferably about 450 to about 550 Ångstroms, is vacuum deposited on the top surface 19 of the cap 18 such as by well known sputtering techniques. A sufficient thickness of the thin adherent metal film 20 must be provided to adequately promote adhesion between the nickel and the polymeric adhesive, such as a silicone elastomer material, while not being so thick that the interbonding layer significantly impacts application.

It is advantageous for the vacuum deposited thin adherent metal film to cover the entire back side surface 19 of the cap 18 and come partially down the exterior side wall, in order to ensure complete coverage of the peripheral edges of the back surface 19 of the cap 18. Also, it is important that steps be taken for proper fixturing of the cap during the sputtering process, to prevent contamination of the seal band, which could degrade the performance of the solder joint that is created at a later stage of the fabrication of the heat sink assembly.

Suitable types of metal materials to be selected for the thin adherent metal film 20 as used to bond nickel, or some other poorly adherable metal to silicon-containing polymeric adhesives, to include chromium and the other metals of Groups IVB, VB, VIB of the Periodic Table of the elements (CAS version), or alloys thereof, excluding the radioactive elements Unq, Unp, and Unh. These metals for forming the thin adherent metal film include Ti, Zr, Hf, V, Nb, Ta, Cr, Mo, and W, and alloys thereof.

The sputter deposited thin adherent metal film 20 is subjected to post-sputtering annealing at a temperature of from slightly above room temperature to 300° C. in an environment of air, nitrogen, argon, or any inert gas.

Then, the cap can be reworked for any pin hole problems by doing a vacuum bake, cleaning, deposition of 1000 Ångstroms to 2 micrometers of nickel (evaporation and/or sputtering), followed by repeating the above sputter depositing process to re-metallize the Cr (or other thin adherent metal material).

The nickel-plated cap preferably is sputter coated on the entire surface area of its top surface 19 with the thin adherent metal film before the cap is hermetically sealed by soldering to the lower substrate 11. This is advantageous as the cap can be precoated as a discrete component and prepared in advance for incorporation into the heat sink assembly at any later convenient time. It is also possible to seal the cap to the lower substrate before sputter coating the thin adherent metal film on the cap, but precautions must be taken in this event to delimit sputter deposition to the top surface of the cap and prevent corruption of other components in the MCM.

To attach the heat sink 22 to the cap 18, a silicon-containing polymeric adhesive, such as a silicone elastomeric adhesive, is applied to either the exposed bottom surface of heat sink 22 when it is still a separate piece, or, alternatively, to the exposed surface of thin adherent metal film 20 after its formation on cap 18. The silicon-containing polymeric adhesive 21 is applied in adequate amounts such that when the thin adherent metal film 20 and the heat sink 22 are brought and pressed together in a manner that the intervening silicon-containing polymeric adhesive spreads and wets out before it sets up or cures, which causes the silicon-containing polymeric adhesive to form a continuous layer 21 between thin adherent metal film 20 and heat sink 22. Formation of a continuous layer of the silicon-containing polymeric adhesive is preferred. The silicone elastomeric adhesive is applied in sufficient amounts to provide an ultimate thickness (as cured) of about 1.0 to 3.0 mils (about 25 to 76 $\mu$m). Once the silicone elastomer material cures, the heat sink 22 is fixedly bonded to the cap 18 via thin adherent metal interface layer 20 and the silicone elastomer material layer 21.

The silicon-containing polymeric adhesives of this invention include silicone elastomeric materials. These silicone elastomeric materials encompass compositions containing silicone polymers as representing at least the predominant component (by weight), or even the exclusive component thereof. The silicone polymers are based on polymeric chains featuring alternating silicon (Si) and oxygen (O) atoms in the backbone, where the backbone is devoid of or substantially devoid of carbon atoms excluding consideration of terminal end groups, and having organic radicals attached to silicon atoms located in the backbone. The repeating unit of such a silicone polymer can be represented with the following formula:

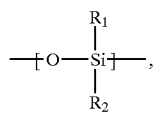

where $R_1$ and $R_2$ each is an organic radical. The organic radical, for example, can be an unsubstituted or substituted group of alkyl, alkenyl, phenyl, trifluoropropyl, and so forth. In linear form (uncross-linked form), the silicone chains generally correspond to degrees of polymerization ranging from about 200 to about 10,000. The consistency of the linear form is a function of the degree of polymerization; the higher the degree of polymerization, the higher the consistency of a given silicone resin, and an opposite effect on consistency occurs for lower degrees of polymerization for a given resin.

To facilitate cross linking (vulcanization, curing), substituents, such as vinyl groups featuring double bonds (unsaturations), can be introduced onto the silicone elastomer compound in small amounts (about 0.5%). Cross-linking also can be facilitated by providing reactive end-groups (e.g., alkoxy, acetoxy) on one or both of the terminal ends of the silicone polymer. These modifications to the silicone polymers, and their effects and purposes, are well-known to those skilled in the art and should need no further elaboration.

A preferred class of silicone elastomeric material is the low-consistency, room-temperature vulcanizing (RTV) elastomers involving low-molecular weight polysiloxanes and generally rely on reactive end groups for cross-linking (cure) at, or only slightly above, room temperature. The so-called one-component (one package, one-part) systems can be used which rely on atmospheric moisture for curing. It is also possible to cross-link the silicone polymer with benzoyl peroxide or other free radical initiators, with or without a catalyst in a so called two part system, such as filled silicone elastomers obtained from Dow-Corning under the trade designations Sylgard™ 6605 and Sylgard™ 601.

As filler adjuvant for the silicone elastomeric material, particulate material can be used as a dispersed phase which increases the stiffness of the polymeric material while possessing such chemical and thermal resistance to be unaffected by processing with a reactive silicone elastomeric system. Suitable filler materials are oxides (e.g., oxides of Al, Be, Ca, Si, Mg, Zn), and/or nitrides (e.g., nitrides of Al, B, Ti), and/or minerals (e.g., kaolin, talc, feldspar, boehmite, baryte ($BaSO_4$), anhydrite ($CaSO_4$)), and so forth. Conventional surface-treated varieties of these fillers also can be used, such those surface-treated by organosilanes to provide a coupling effect between the filler particle (as the dispersed phase) and the dispersion medium (i.e., the silicone elastomeric material in this invention). The flexibility (hardness) of the elastomer can be adjusted by manipulating the relative amount of filler. The amount of filler added, generally speaking, should be an amount large enough to increase the stiffness of the silicone elastomer to inhibit free flowability of the uncured precursor, but not so great as to compromise tack and/or flexibility of the silicone. One of skill can ascertain optimal amounts for a given type of filler, if used, for a silicone elastomer material, such as in terms of monitoring stiffness, flow property management, tack, flexibility, and so forth, by simple observation and empirical determination.

The addition of other adjuvants to the silicone polymer, such as anti-oxidants, colorants, stabilizers, are permitted to the extent that the material or its amount do not interfere with the requisite adhesive or mechanical properties of the silicone adhesive.

The silicone elastomeric materials usable in the invention can tolerate temperatures normally experienced in heat sink assemblies for MCM's without thermally degrading. Mechanical properties of the silicone elastomer material are little affected over a wide range of temperature (e.g., −90° C. to 250° C.). The silicone elastomeric material achieves excellent adhesion to the thin metal bonding film when curing occurs in contact with that substrate. Silicone elastomers, in general, have good chemical inertness but are sensitive to swelling by hydrocarbon solvents; thus care must be taken in regard to the latter once the silicone elastomer is applied in the heat sink assembly. Otherwise the silicone elastomers have good resistance to oils and greases and they have excellent and stable insulating (dielectric) electrical properties.

As mentioned above, the MCM has a hermetic seal band provided between cap 18 and lower substrate 11. As illustrated in FIG. 1, the nickel plated cap is selectively gold plated at lower cap ends 25 which are hermetically sealed to the lower substrate 11 by a solder 23 (e.g. Pb/Sn) at a seal band 24 (e.g., Ni/Au) on the lower substrate 11.

Using the present invention, good bonding strength is provided between a silicon-containing polymeric adhesive, particularly a silicone elastomeric material, and a nickel plated cap surface. The adhesive failures are cohesive (no delamination between the nickel, chromium or other thin adherent metal film materials of the invention, and silicon-containing polymeric adhesive) at time zero and after stress testing. Several other possible modes of bonding the nickel-plated cap to a silicone elastomeric material were determined not to work. For example, aluminum, titanium/aluminum and gold plating the nickel plating on the cap followed by titanium/aluminum sputter metallization was tried but blistering at the nickel interface was encountered and there were peeling problems after stress testing. Also, ashing oxidation and reduction process on the nickel surface were tried but the bond had inadequate shear strength after stress testing. Chemical etching or mechanical roughening of the nickel surface also were tried in an effort to promote the nickel-silicone elastomeric material bond but were not satisfactory. For instance, etching was found to provide sufficient adhesion strength, but maximum benefit was only realized if adhesion were performed immediately after etching, as the benefit degrades with time (e.g., likely due to reformation of native nickel oxide on the newly exposed surface regions). This circumstance prevents etching well in advance of the installation of the cap (i.e., bonding to the silicone elastomeric material). Therefore, etching would need to be performed after encapsulation, which would require challenging fixturing to protect the rest of the module from the etching process fluids.

While the invention has been exemplified above, for convenience sake, in terms of silicon-containing polymeric adhesives, such as silicone elastomeric materials, as the heat sink adhesive, it is contemplated that the invention also can be applied to polymeric adhesives in general. That is, the polymeric adhesive used to bond the heat sink to the MCM can be a thermoplastic, a thermosetting, or an elastomeric polymer material provided it has suitable heat sink adherability, water impermeability, resistance to swelling in hydrocarbon solvents, and the like attributes that are appropriate for an MCM environment. Although not required, it is also often desirable to use a polymeric adhesive as the heat sink adhesive which can be reworked after application and initial hardening. A reworkable adhesive means an adhesive having a "thermoplastic" character in the sense that it offers the advantage, convenience and manufacturing flexibility in that it can be reworked (softened) after initial application, upon heating, and then resolidified (restored) after rework upon cooling. One of ordinary skill can select and adapt appropriate polymeric materials for use as the heat sink adhesive in the present invention by keeping these types of criteria in mind.

For example, other types of polymeric adhesives contemplated by this invention include, for example, siloxane polyimides, such as block copolymer forms of this silicon-containing polymer marketed under the trade mark Altisil™ (SPI series) by General Electric Company. Thermoplastic elastomers, such as olefinic, styrenic, polyurethane, and polyesters types thereof are also contemplated as polymeric heat sink adhesives of this invention. Further, hydrosilylated thermoplastic elastomeric materials are also contemplated; this class of elastomers relates to multifunctional organo-silicon molecules derived from the hydrosilylation of carbon-carbon double bonds of an unsaturated synthetic elastomer.

Although the invention finds primary application in a cooling system for MCM's, it has general applicability to other types of heat transfer systems. Also, the invention is generally useful for meeting silicon-containing polymeric adhesive bonding requirements involving a metal having poor direct adherability to such silicon-containing polymeric adhesives.

While certain embodiments of the invention have been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

We claim:

1. A method for bonding a silicon-containing polymeric adhesive to a metal having poor direct adherability to such polymeric adhesive, comprising the steps of:
   (a) providing an uncured silicone elastomeric material and a substrate comprising a substrate surface containing nickel;
   (b) depositing a thin adherent metal film on said substrate surface, wherein said thin adherent metal film is a metal selected from the group consisting of chromium, Mo, and W, and alloys thereof and;
   (c) contacting said silicone elastomeric material to said thin adherent metal film; and
   (d) solidifying said silicone elastomeric material, wherein said thin adherent metal film has a thickness effective to bond said substrate surface to said polymeric adhesive.

2. The method of claim 1 wherein said nickel containing substrate surface has a shear strength to silicone elastomeric material of less than 150 lbs./inch$^2$.

3. The method of claim 1 wherein said thin adherent metal film is a metal selected from the group consisting of chromium and alloys of chromium.

4. The method of claim 1 wherein said depositing of said thin adherent metal film comprises sputtering.

5. The method of claim 1 wherein said thin adherent metal film is deposited in a thickness of from 50 Ångtroms to 10,000 Ångstroms.

6. The method of claim 1 wherein said substrate surface is sputter etched prior to step (b) adequate to remove native nickel oxide.

7. The method of claim 1 wherein said silicone elastomeric material comprises a silicone polymer adhesive cured in step (d) at room temperature.

8. The product of the process of claim 1.

9. The product of the process of claim 3.

10. The method of claim 1 wherein said thin adherent metal film is deposited in a thickness of from 450 Ångstroms to 550 Ångstroms.

* * * * *